(12) United States Patent
Sun et al.

(10) Patent No.: US 9,799,409 B2
(45) Date of Patent: Oct. 24, 2017

(54) READ-ONLY MEMORY (ROM) ARCHITECTURE WITH SELECTIVE ENCODING

(71) Applicant: Avago Technologies General IP (Singapore) Pte. Ltd., Singapore (SG)

(72) Inventors: Dechang Sun, Eden Prairie, MN (US); Wei Zhang, Eagan, MN (US); Mai T. MacLennan, Plymouth, MN (US); Sudeep Ashok Pomar, Chanhassen, MN (US); Roy M. Carlson, Hamel, MN (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/143,160

(22) Filed: Apr. 29, 2016

(65) Prior Publication Data

US 2017/0278582 A1    Sep. 28, 2017

Related U.S. Application Data

(60) Provisional application No. 62/313,459, filed on Mar. 25, 2016.

(51) Int. Cl.
| | | |
|---|---|---|
| *G11C 17/14* | (2006.01) | |
| *G11C 17/08* | (2006.01) | |
| *G11C 14/00* | (2006.01) | |
| *G11C 17/10* | (2006.01) | |

(52) U.S. Cl.
CPC .............. *G11C 17/14* (2013.01); *G11C 14/00* (2013.01); *G11C 17/08* (2013.01); *G11C 17/10* (2013.01)

(58) Field of Classification Search
CPC .......... G11C 14/00; G11C 17/10; G11C 17/14
See application file for complete search history.

(56) References Cited

U.S. PATENT DOCUMENTS

| | | | | |
|---|---|---|---|---|
| 4,773,047 A | * | 9/1988 | Uchino ................. | G11C 17/16 365/104 |
| 5,289,406 A | * | 2/1994 | Uramoto ................. | G11C 11/56 365/104 |
| 8,300,493 B2 | | 10/2012 | Buer et al. | |
| 8,406,031 B2 | | 3/2013 | Buer et al. | |
| 8,830,721 B2 | | 9/2014 | Buer et al. | |

* cited by examiner

*Primary Examiner* — Vanthu Nguyen
(74) *Attorney, Agent, or Firm* — Sterne, Kessler, Goldstein & Fox P.L.L.C.

(57) ABSTRACT

Embodiments provide improved memory bitcells, memory arrays, and memory architectures. In an embodiment, a memory array includes a plurality of memory cells to store data bits. Each of the plurality of memory cells includes a transistor having drain, source, and gate terminals, and a plurality of program nodes, each of the program nodes charged to a predetermined voltage and coupled to a respective one of a plurality of bit lines. For each memory cell in a subset of the plurality of memory cells, none of the plurality of program nodes is coupled to the drain terminal of the transistor to program the each memory cell in the subset of the plurality of memory cells to store at least one data bit, the at least one data bit is most occurred between the data bits.

22 Claims, 11 Drawing Sheets

400

| BL₀ | BL₁ | BL₂ | dout[1:0] |
|---|---|---|---|
| 1 | 1 | 1 | 00 |
| 1 | 1 | 0 | 01 |
| 1 | 0 | 1 | 10 |
| 0 | 1 | 1 | 11 |

401

"00" dominating dout1 = $\overline{(BL0 \& BL1)}$
dout0 = $\overline{(BL0 \& BL2)}$  ~ 402

| BL₀ | BL₁ | BL₂ | dout[1:0] |
|---|---|---|---|
| 1 | 1 | 0 | 00 |
| 1 | 1 | 1 | 01 |
| 1 | 0 | 1 | 10 |
| 0 | 1 | 1 | 11 |

403

"01" dominating dout1 = $\overline{(BL0 \& BL1)}$
dout0 = BL1 & BL2  ~ 404

| BL₀ | BL₁ | BL₂ | dout[1:0] |
|---|---|---|---|
| 1 | 1 | 0 | 00 |
| 1 | 0 | 1 | 01 |
| 1 | 1 | 1 | 10 |
| 0 | 1 | 1 | 11 |

405

"10" dominating dout1 = BL1 & BL2
dout0 = $\overline{(BL0 \& BL1)}$  ~ 406

| BL₀ | BL₁ | BL₂ | dout[1:0] |
|---|---|---|---|
| 1 | 1 | 0 | 00 |
| 1 | 0 | 1 | 01 |
| 0 | 1 | 1 | 10 |
| 1 | 1 | 1 | 11 |

407

"11" dominating dout1 = BL1 & BL2  ~ 408
dout0 = BL0 & BL2

FIG. 4

READ-ONLY MEMORY (ROM) ARCHITECTURE WITH SELECTIVE ENCODING

CROSS REFERENCE TO RELATED APPLICATIONS

The present application claims priority to U.S. Provisional Patent Application No. 62/313,459, filed on Mar. 25, 2016, which is incorporated herein by reference in its entirety.

BACKGROUND

Field

The present disclosure relates generally to memory bit-cells, arrays, and architectures.

Background

Today, various products and applications (e.g., Bluetooth products, wireless local area network (WLAN) products, mobile baseband and multimedia processors, etc.) require significant amounts of on-chip read-only memory (ROM).

Conventional ROM bitcells, bitcell arrays, and memory architectures suffer from a number of problems, including area inefficiency, high cost, and high power consumption due to high current leakage, for example.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

Figure 3A:
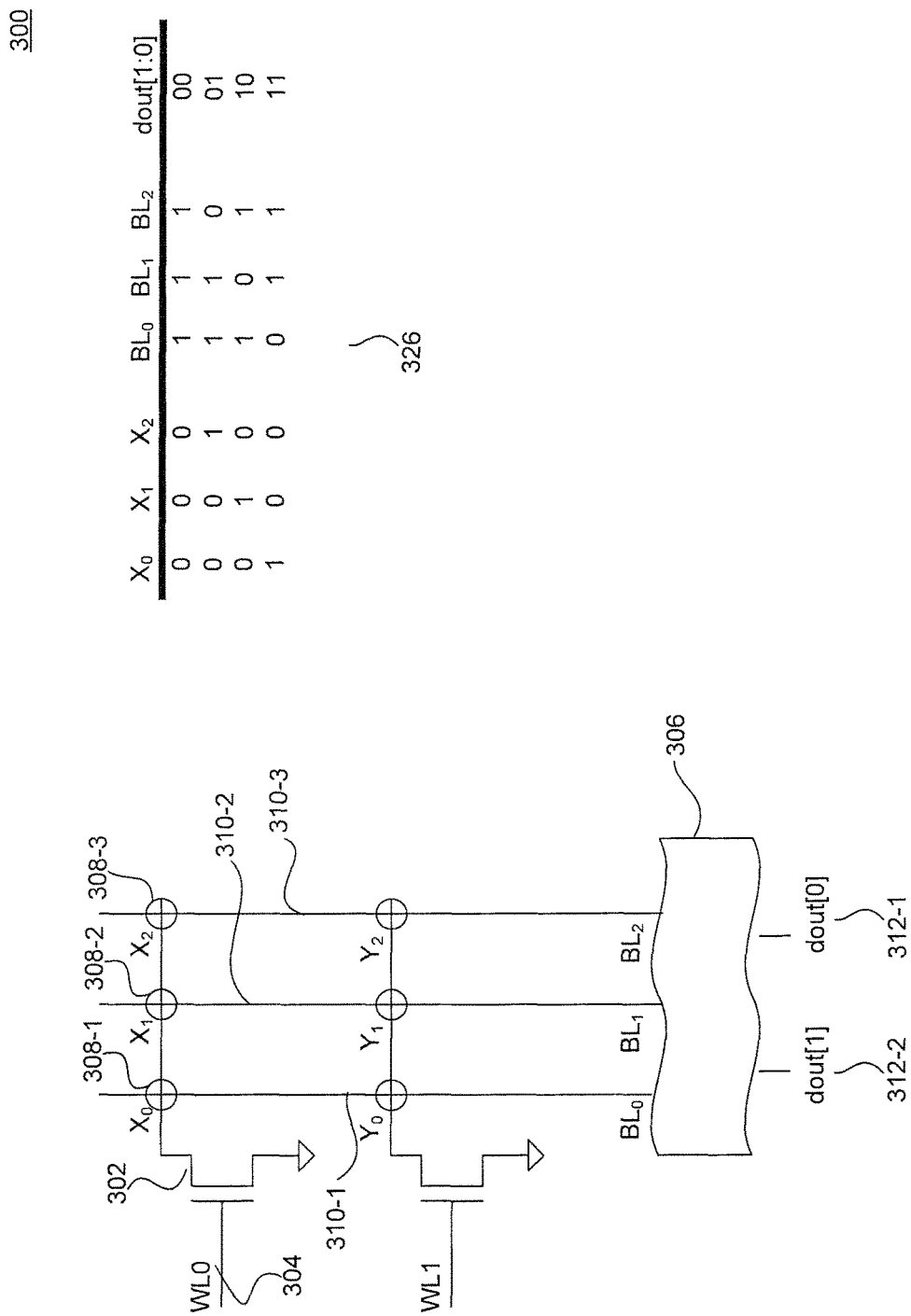
Figure 3B:
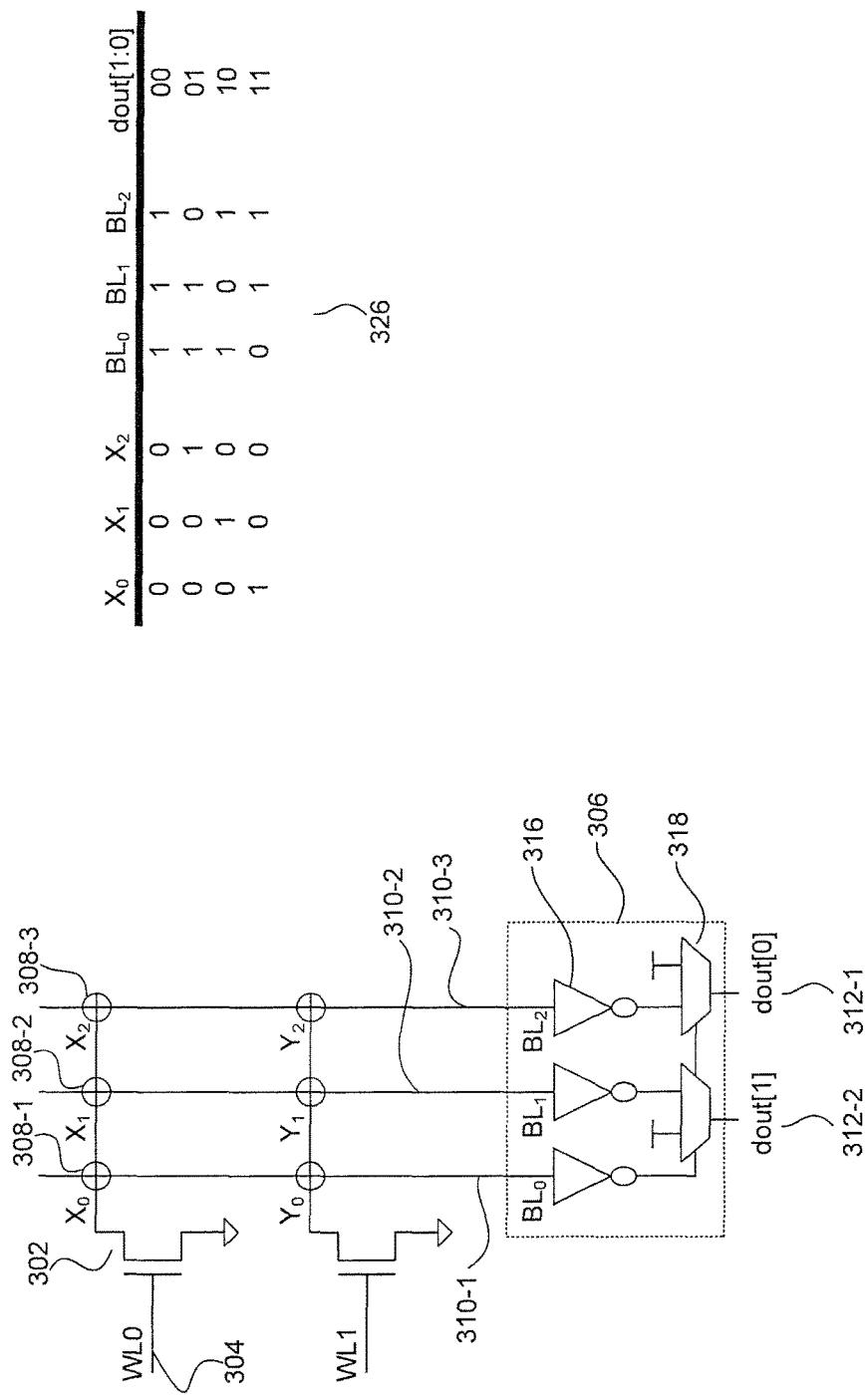

FIGS. 3A-B illustrate an example memory array 300 according to an embodiment of the present disclosure.

Figure 3C:
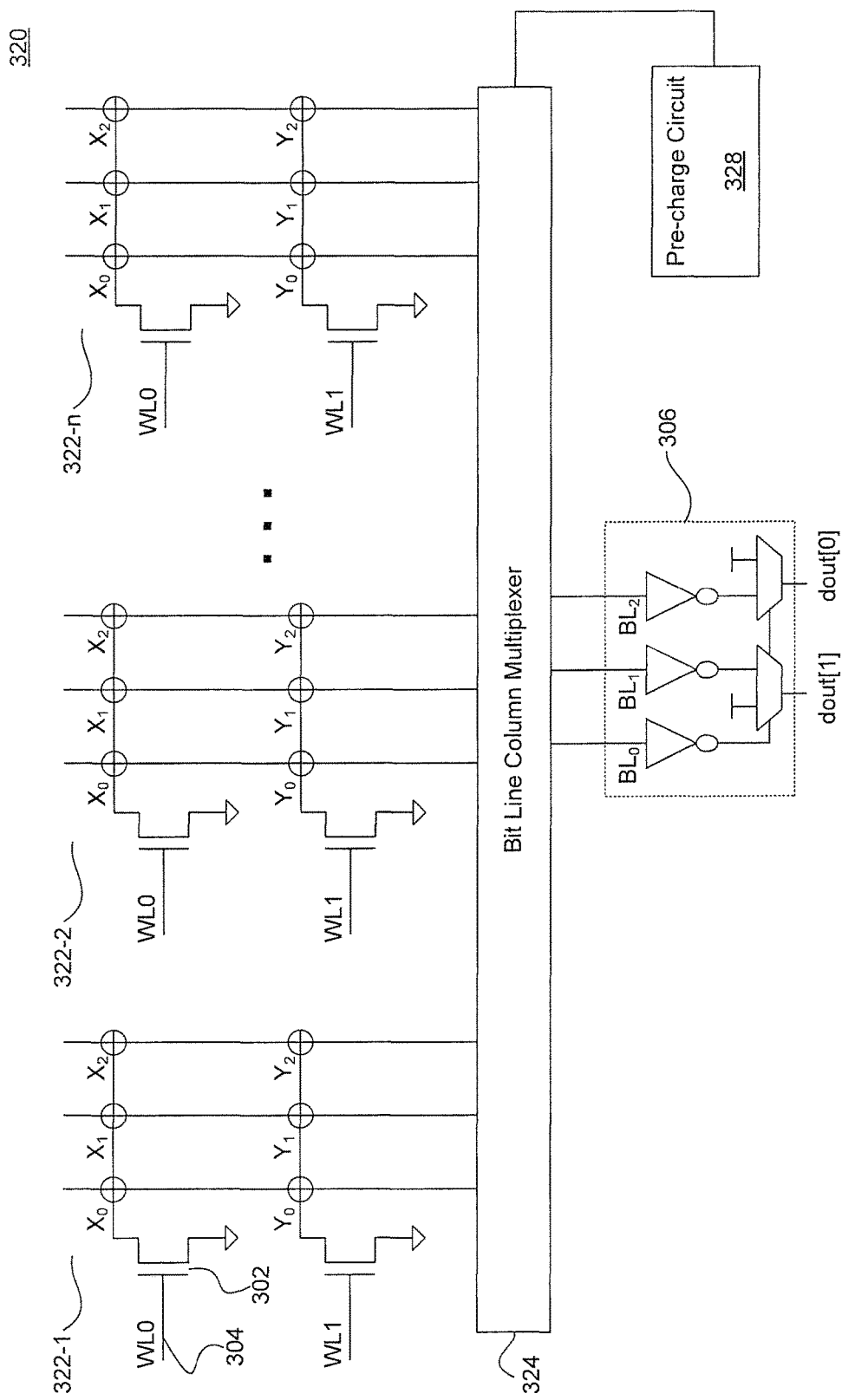

FIG. 3C illustrates an example memory array 320 according to an embodiment of the present disclosure.

FIG. 4 illustrates exemplary memory programming and decoding methods according to an embodiment of the present disclosure.

Figure 5:
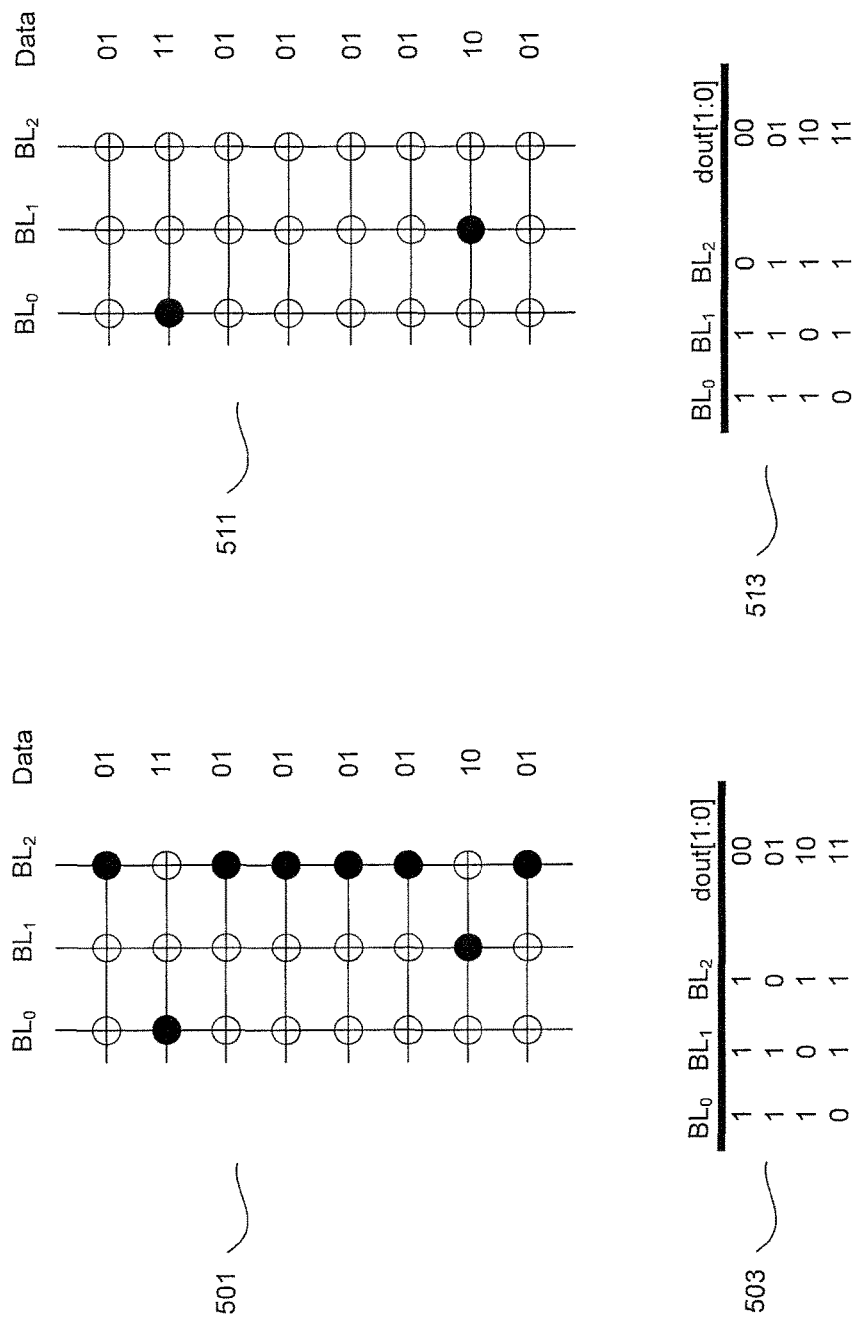

FIG. 5 illustrates example memory arrays according to an embodiment of the present disclosure.

Figure 6:
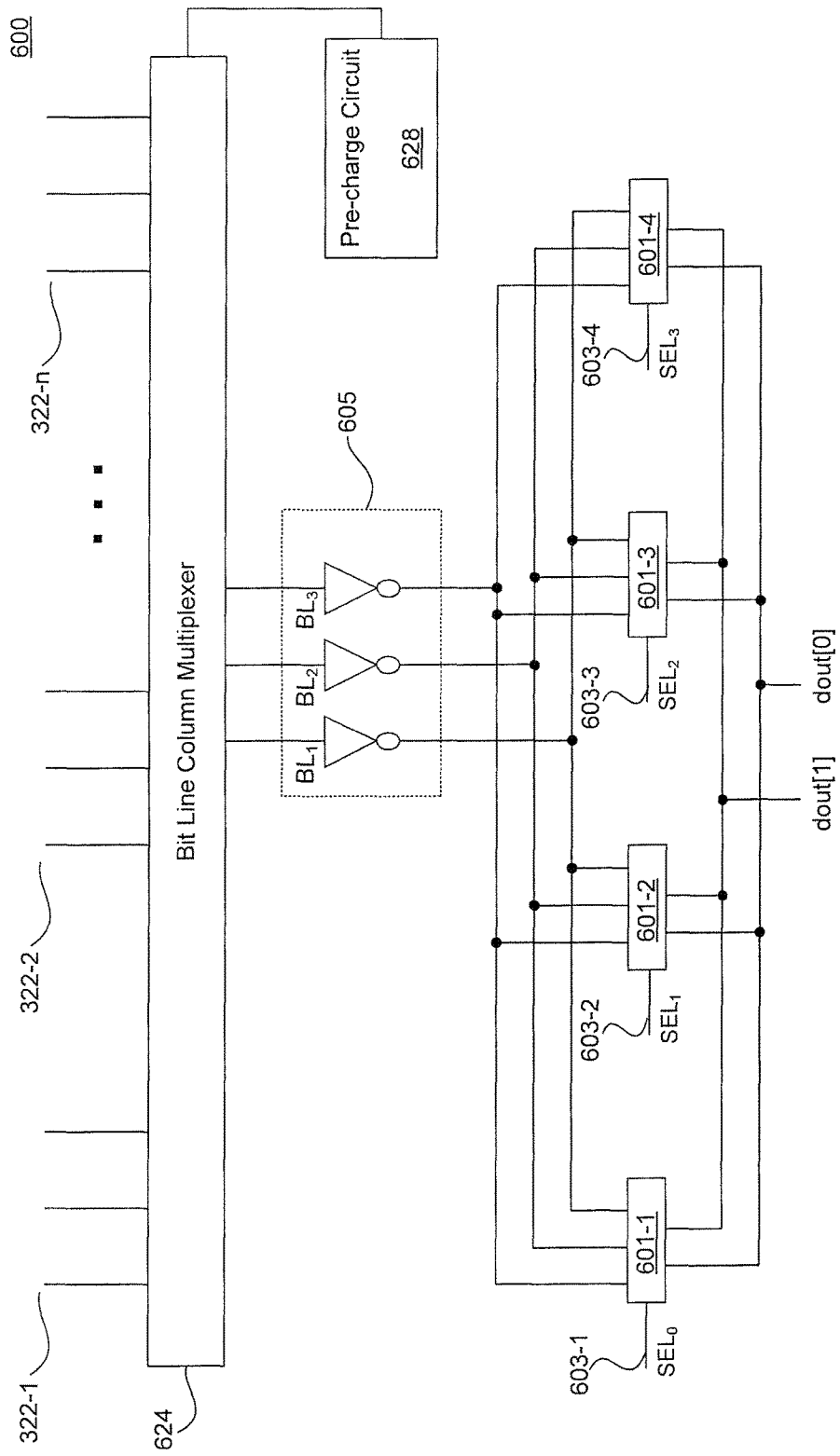

FIG. 6 illustrates an example selective decoding circuit according to an embodiment of the present disclosure.

Figure 7:
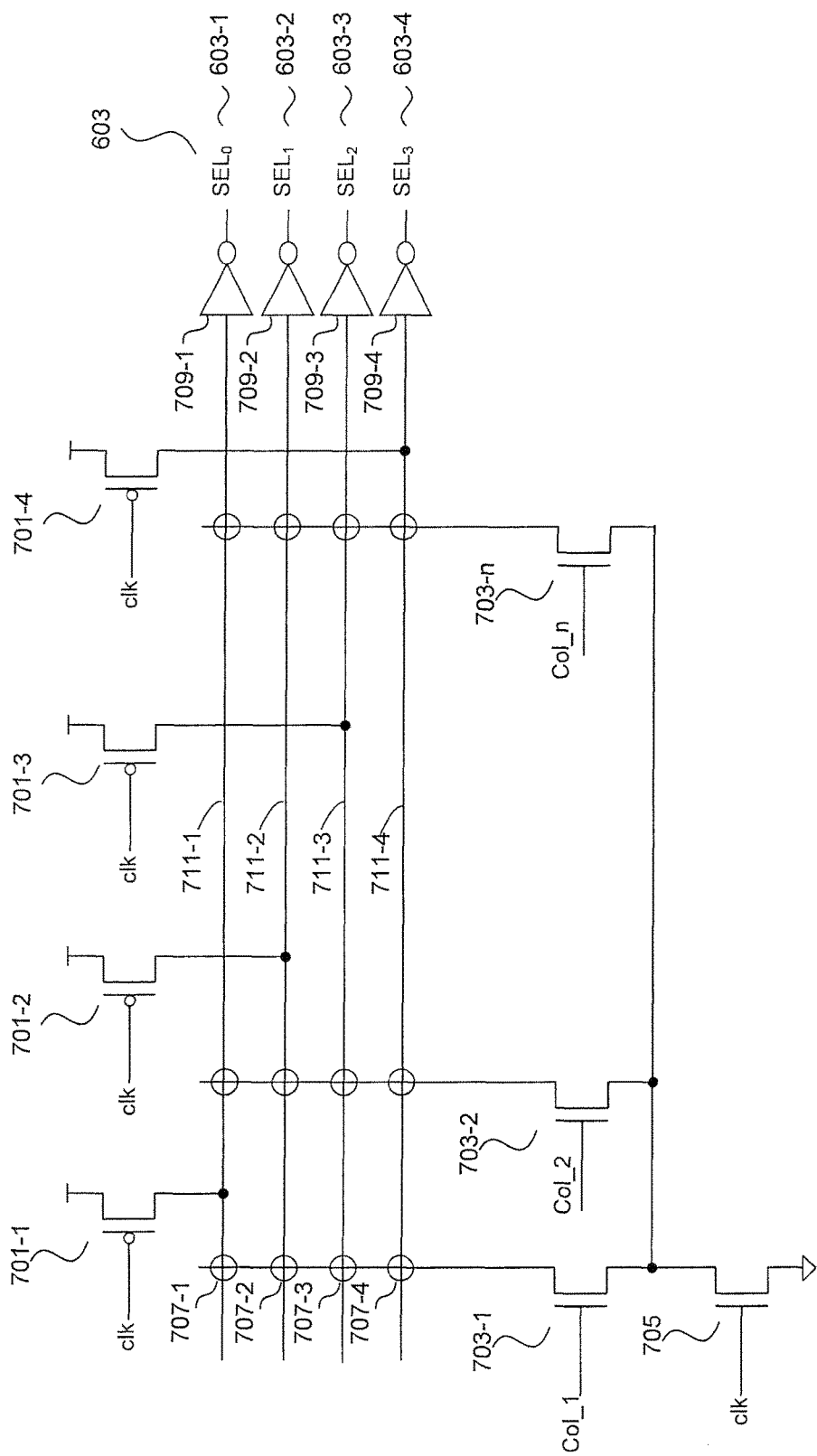

FIG. 7 illustrates an exemplary control circuit 700 according to an embodiment of the present disclosure.

Figure 8:
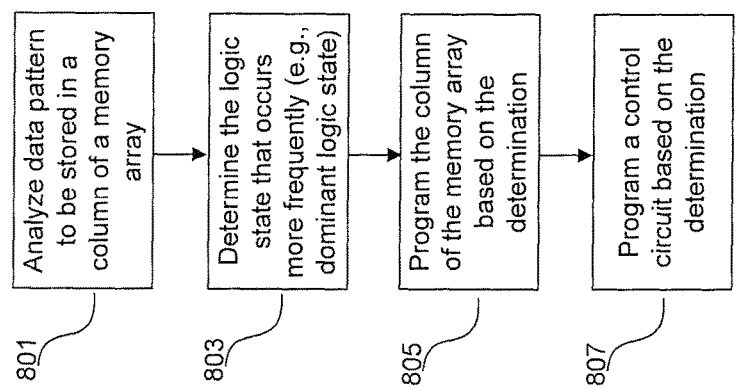

FIG. 8 illustrates a method 800 according to an embodiment of the present disclosure.

Figure 9:
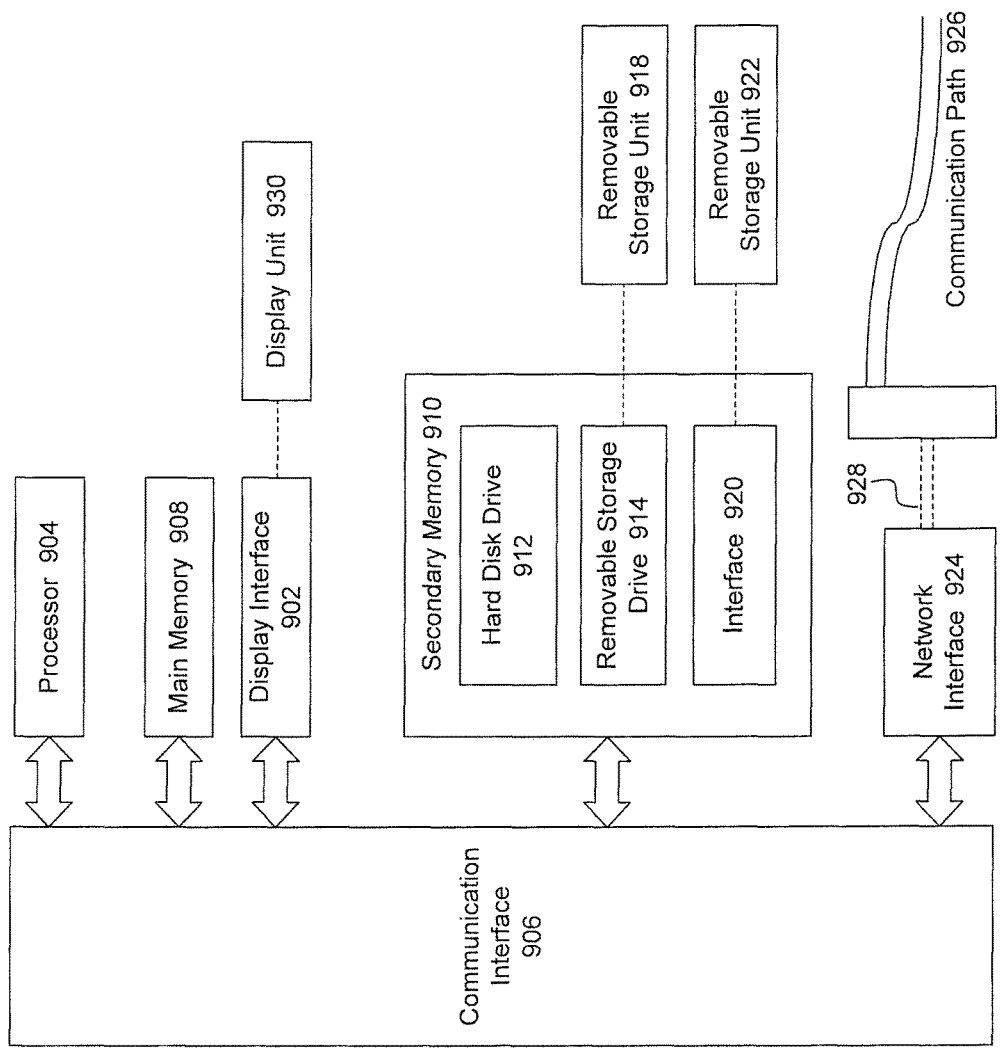

FIG. 9 illustrates a computer system that can be utilized to implement one or more embodiments of the present disclosure.

The present disclosure will be described with reference to the accompanying drawings. Generally, the drawing in which an element first appears is typically indicated by the leftmost digit(s) in the corresponding reference number.

DETAILED DESCRIPTION OF EMBODIMENTS

Overview

Embodiments provide improved memory bitcells, memory arrays, and memory architectures.

According to one embodiment of the disclosure, a read only memory (ROM) includes a plurality of bit lines charged to a predetermined voltage prior to a read cycle of the ROM, and a column of memory cells. Each memory cell stores data having a logic state that is one of a plurality of available logic states stored by the column of memory cells. The plurality of available logic states are characterized by a dominant logic state and a plurality of remaining logic states that are not the dominant logic state, where the dominant logic state is the most numerous logic state stored in the column of memory cells. Each memory cell includes a transistor having a drain, source, and gate terminals; and a plurality of program nodes, where each program node is connected to a corresponding bit line of the plurality of bit lines and is capable of being connected to the drain terminal of the transistor. During programming, the plurality of remaining logic states are stored in a first subset of memory cells of the column by a connection between a corresponding program node and the drain terminal of the transistor in each memory cell of the first subset of memory cells. Whereas, the dominant logic state is stored in a second subset of memory cells of the column of memory cells by an absence of connections between all of the plurality of program nodes and the drain terminal of the transistor in each memory cell of the second subset of memory cells.

According to another embodiment of the disclosure, a control circuit for selective encoding of a memory cell includes a transistor having drain, source, and gate terminals. The control circuit further includes a plurality of program nodes, each of the program nodes charged to a predetermined voltage and coupled to a respective one of a plurality of selection lines. At most one of the plurality of program nodes is coupled to the drain terminal of the transistor to select a decoding method for the memory cell.

DETAILED DISCUSSION

Figure 1:
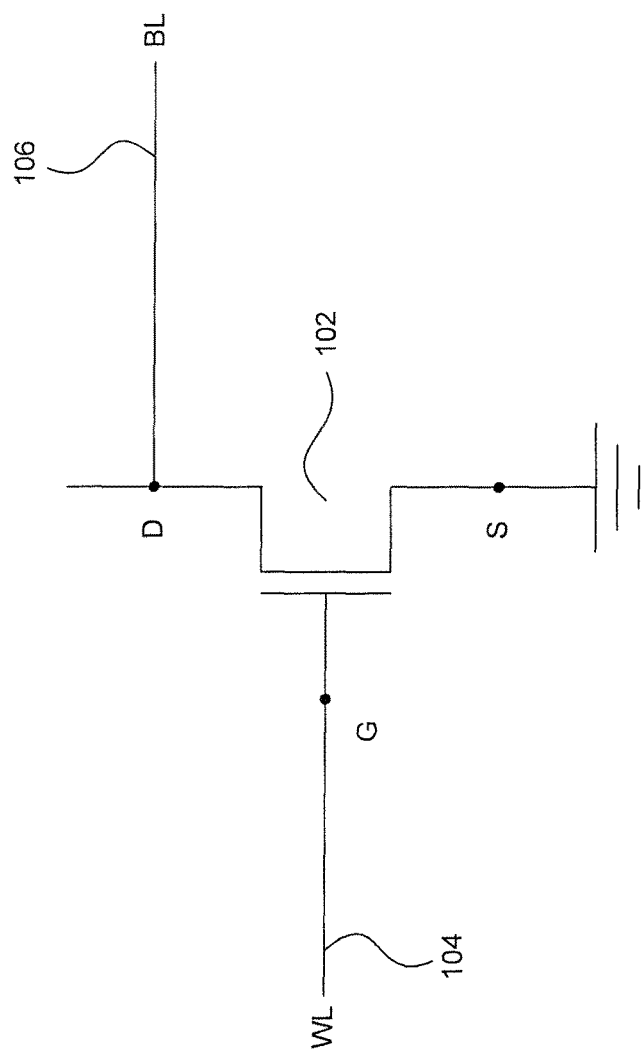
FIG. 1 illustrates a conventional memory bitcell.

FIG. 1 illustrates a conventional ROM bitcell 100. As shown in FIG. 1, bitcell 100 includes a MOS (Metal Oxide Semiconductor) transistor 102. Typically, the source terminal of MOS transistor 102 is coupled to ground, and the drain terminal of MOS transistor 102 is pre-charged to a predetermined voltage value. The gate terminal of MOS transistor 102 is coupled to a word line (WL) 104, and the drain terminal of MOS transistor 102 is selectively connected (either coupled or not) to a bit line (BL) 106 (depending on whether a logic 1 or a logic 0 is programmed in the bitcell). Generally, a logic "1" is stored by connecting the bit line to the drain terminal, and a logic "0" is stored by not connecting the bit line to the drain terminal, however this logic structure can be reversed. Typically, the BL 106 can be stepped and repeated, but only one the multiple BLs will be connected to the drain of MOS transistor 102.

In standby mode (i.e., when bitcell 100 is not being read), a low voltage (e.g., ground) is applied on WL 104. When bitcell 100 is being read, the voltage on WL 104 is raised (or in other words, WL 104 is activated) and MOS transistor 102 will turn ON. Consequently, the voltage on BL 106 will either pull down to ground if the drain terminal of MOS transistor 102 is connected to BL 106 or remain at its initial value if the BL 106 is not connected to the drain terminal, thereby reflecting the logic value stored in the bitcell. For example, the voltage on BL 106 would fall to a low value when a logic 1 is stored in bitcell 100, and remain high when a logic 0 is stored in bitcell 100. Generally, a sensing circuit (e.g., inverter circuit) is used to sense the voltage on BL 106, and output the logic value corresponding to the voltage.

Various techniques exist for programming bitcell 100. For example, bitcell 100 may be programmed at manufacture time by masking. Accordingly, the combination/pattern of conductive/insulation layers and vias act to connect the drain terminal of bitcell 100 to a first voltage supply if a logic 1 is to be stored in bitcell 100, and to a second voltage supply if a logic 0 is to be stored in bitcell 100. When data programming is done by masking, the data programmed in bitcell 100 may not be changed during operation. Alternative techniques can be used if re-programming of the data is desired.

As described above, conventional bitcell 100 allows for a single logic state or bit to be stored therein. As a result, when large amounts of ROM are needed, conventional bitcell array solutions tend to be large in area and thus high in cost. Embodiments of the present disclosure, as further described below, provide improved ROM bitcell structures, bitcell arrays, and ROM architectures having increased data storage capabilities, smaller area, lower cost, improved speed, and significantly reduced power consumption/loss.

Figure 2:
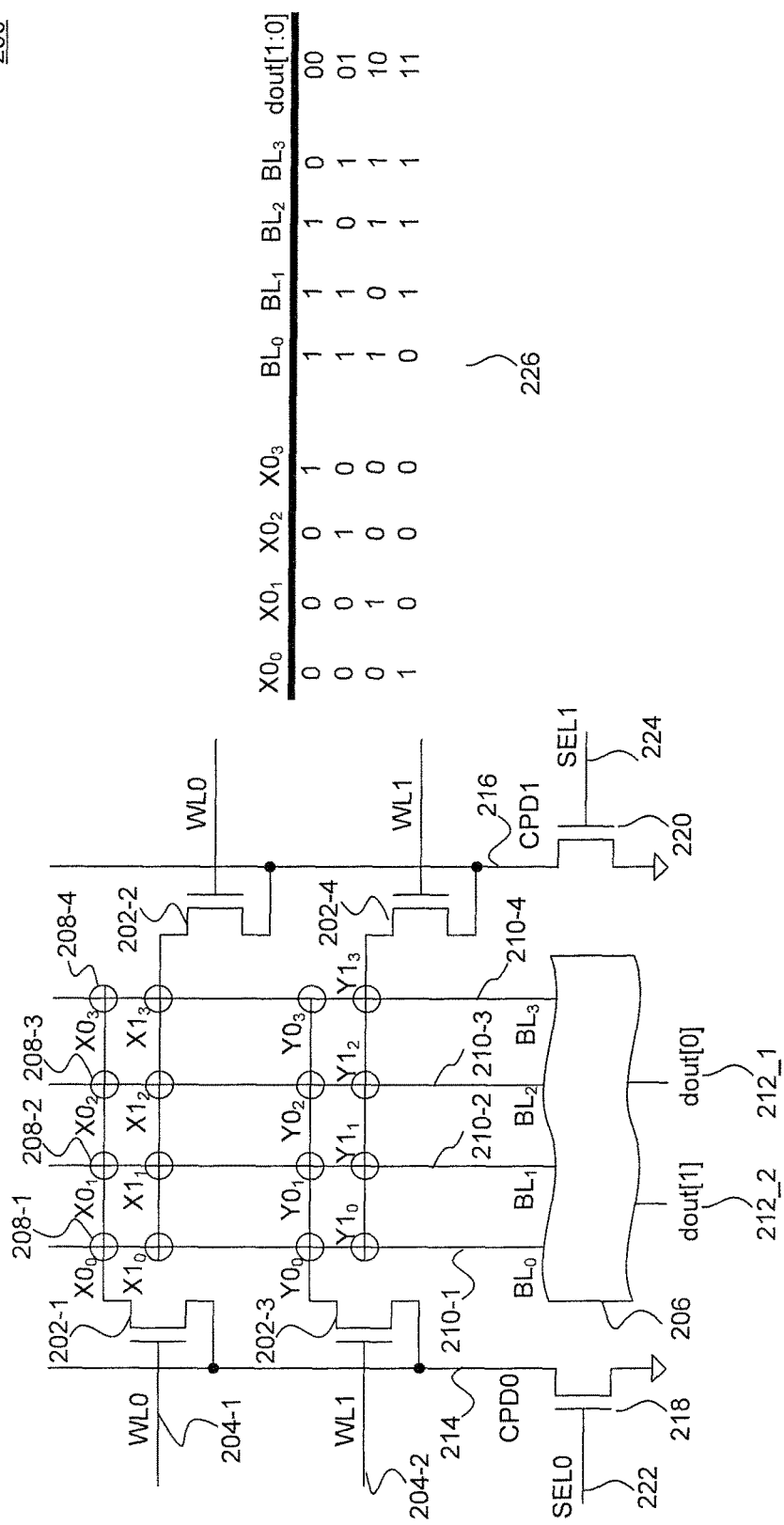
FIG. 2 illustrates a conventional memory array.

FIG. 2 illustrates a conventional memory array 200. Memory array 200 represents an encoded ROM array. For simplification purposes, only two rows and two columns of example memory array 200 are shown in FIG. 2. However, as would be understood by a person of skill in the art based on the teachings herein, example memory array 200 may include any number of rows/columns, depending on the use requirements of the array.

As shown in FIG. 2, example memory array 200 includes a plurality of memory cells, with each memory cell including a MOS transistor 202 and four associated program nodes 208. For example, MOS transistor 202-1 and program nodes 208-1, 208-2, 208-3, and 208-4 comprise one memory cell of memory array 200. Thus, example memory array 200 includes four memory cells as shown in FIG. 2.

Each memory cell of example memory array 200 can be programmed to store two bits of data (00, 01, 10, and 11), by connecting only one of its associated program nodes to the drain terminal of its MOS transistor. This connection can be done using a via, a piece of metal, etc. The logic state (i.e., 00, 01, 10, or 11) stored in the memory cell is determined by which of its associated program nodes is coupled to the drain terminal of its MOS transistor. For example, to store a "00" in the memory cell of MOS transistor 202-1, the drain terminal of MOS transistor 202-1 may be coupled to program node 208-4. To store a "01" in the same memory cell, the drain terminal of MOS transistor 202-1 may be coupled to program node 208-3, and so on.

As shown in FIG. 2, each memory cell of example memory array 200 is coupled through its associated program nodes 208 to four bit lines 210. Bit lines 210 are used to read out the data stored in the memory cell. For example, the memory cell of MOS transistor 202-1 is coupled through its associated program nodes 208-1, 208-2, 208-3, and 208-4 to four bit lines 210-1, 210-2, 210-3, and 210-4. To reduce area, bit lines 210 are shared vertically and horizontally among multiple memory cells. For example, bit lines 210-1 through 210-4 are shared vertically by the memory cells of MOS transistors 202-1 and 202-3, and 202-2 and 202-4; and are shared horizontally by the memory cells of MOS transistors 202-1 and 202-2, and 202-3 and 202-4.

In addition, each memory cell is associated with one word line and one common pull down (CPD) line which are activated (i.e., pulled high or low) to access the data stored in the memory cell. The word line is coupled to the gate terminal of the MOS transistor of the memory cell, and the CPD line is coupled to the source terminal of the MOS transistor of the memory cell.

Further, to minimize area, word lines and CPD lines can be shared among memory cells according to embodiments of the present disclosure. For example, in memory array 200, the memory cells of MOS transistors 202-1 and 202-2 share the same WL0 204_1, and are said to have the same row memory address. Likewise, the memory cells of MOS transistors 202-3 and 202-4 share the same WL0 204_2. Similarly, although not shown, memory cells having adjacent column memory address may share the same CPD line.

To access a given memory cell, its associated WL and CPD line are activated simultaneously. For example, to access the memory cell of MOS transistor 202-1, both WL 204-1 and CPD line 214 are activated. In an embodiment, this includes switching WL 204-1 from low (e.g., ground) to high (e.g., Vdd) and pulling down CPD line 214 from high (e.g., Vdd) to low (e.g., ground). Program nodes 208 (of every memory cell) are pre-charged to a high value voltage before each read cycle. Thus, when WL 204-1 and CPD 214 are activated, MOS transistor 202-1 turns ON, causing the program node voltage actually connected to the drain terminal of MOS transistor 202-1 to fall down from its pre-charged high value voltage to a low voltage (e.g. ground). Because only one of program nodes 208-1, 208-2, 208-3, and 208-4 during programming is connected to the drain terminal of MOS transistor 202-1, when MOS transistor 202-1 turns ON, a single one of the voltages of program nodes 208-1, 208-2, 208-3, and 208-4 will fall and the others will continue to reflect the high voltage value. The specific falling program node determines the logic state stored in the memory cell. The operation of the memory cell 200 is further illustrated by the logic truth table 226. The portion $X0_0, X0_1, X0_3, \ldots$ represents the programming state of each node 208, wherein a "1" indicates that the node is "programmed," e.g. connected to the drain terminal of the corresponding cell transistor 202. The portion $BL_0, BL_1, BL_3, \ldots$ indicates the voltage measured during the read phase, where a "1" indicates the pre-charge voltage is maintained, and a "0" indicates the pull down of the voltage that occurs for the node that is programmed.

The example memory array 200 uses the CPD functionality. In particular, example array 200 includes first and second CPD lines 214 and 216 for selecting the memory column being accessed (the word lines 204 select the memory row being accessed). In an embodiment, CPD lines 214 and 216 are controlled respectively by select signals 222 and 224. For example, as shown in FIG. 2, select signals 222 and 224 drive respectively the gate terminals of transistors 218 and 220, with CPD line 214 being connected to the drain terminal of transistor 218 and CPD line 216 being connected to the drain terminal of transistor 220.

To enable sharing of bit lines 210 among memory columns, select signals 222 and 224 are controlled so that one or the other is high at any given time. This in turn ensures that one or the other of CPD lines 214 and 216 is active at any given time, and that no two adjacent column memory cells (sharing the same bit lines 210) are accessed simultaneously.

In an embodiment, a sensing circuit 206 (e.g., a differential sense amplifier) is coupled to bit lines 210-1 through 210-4 in order to decode the voltage value transitions on bit lines 210-1 through 210-4 into data. The sensing circuit 206 outputs 2 bits dout 212 based on the respective voltages sensed on bit lines 210-1 through 210-4. The sensing circuit 206 only needs partial bit line swing to correctly sense the data. The smaller bit line swing translates into less power consumption and higher speed.

As would be understood by a person skilled in the art based on the teachings herein, memory cell/array embodiments are not limited to 2-bit memory cells as described above in FIG. 2, but extend to n-bit memory cells where n is any integer number. Further, embodiments are not limited to the example memory cell structure in FIG. 2 (i.e., with four program nodes per memory cell), but extend to memory cell structures having more or less than four program nodes per memory cell and more or less than four bit lines coupled to each memory cell. Example memory arrays are disclosed in U.S. Pat. Nos. 8,300,493, 8,406,031, 8,830,721, which are hereby incorporated by reference in their entirety. Additional example memory arrays according to embodiments are provided below for further illustration.

FIGS. 3A-B illustrate an example memory array 300 according to an embodiment of the present disclosure. For simplification purposes, a single column of the memory array is shown in FIGS. 3A-B. Therefore, CPD lines are omitted, and the source terminals of the MOS transistors 302 are shown being coupled to ground. However, a person of skill in the art would appreciate based on the teachings herein that example memory array 300 can be implemented using a CPD functionality as described above in FIG. 2, for example. Alternatively, the memory array 300 can be implemented using multiple columns where the multiple columns do not share the bit lines. If the columns of the memory array do not share the bit lines, the memory array 300 can be implemented without using a CPD functionality and the source terminals of the memory cell transistors will be coupled to ground.

As shown in FIG. 3A, each memory cell in example array 300 includes a MOS transistor 302 and three associated program nodes 308-1, 308-2, and 308-3. The gate terminal of MOS transistor 302 is coupled to a word line (WL) 304, which is raised high when the memory cell is being accessed. Program nodes 308-1, 308-2, and 308-3 are coupled to respective bit lines 310-1, 310-2, and 310-3, which are pre-charged as described above, and used to read the data stored in the memory cell. In an embodiment, bit lines 310-1, 310-2, and 310-3 are input into a decoder circuit 306, which generates data signals 312-1 and 312-2 that represent the data stored in the memory cell. An example embodiment of decoder circuit 306 is shown in FIG. 3B.

Each memory cell in example array 300 can be programmed to store up to two bits. In an embodiment, programming is performed by connecting at most one of the associated program nodes 308 of the memory cell to the drain terminal of the MOS transistor of the memory cell. Thus, the logic state (i.e., 00, 01, 10, or 11) stored in the memory cell is determined by which, if any, of its associated program nodes is connected to the drain terminal of its MOS transistor. For example, as illustrated by the truth table 326 shown in FIG. 3A, a "00" logic state is programmed in the memory cell by not connecting any of program nodes 308-1, 308-2, and 308-3 to the drain terminal of MOS transistor 302. Thus, when WL 304 is raised, each of bit lines 310-1, 310-2, and 310-3 will remain at a high voltage (i.e., floating), to reflect the "00" encoded state. Similarly, to encode a "01" logic state, only program node 308-3 is connected to the drain terminal of MOS transistor 302, and program nodes 308-1 and 308-2 are kept floating.

It is noted that example memory array 300 requires three program nodes per memory cell (compared to four in example array 200) and three bit lines per memory column (bit lines can also be shared between adjacent columns). As a result, chip area is saved. This occurs because the bit line voltage set of 111 is defined as a logic state the truth table 320, which was not the case in the truth table of FIG. 2. The bit line voltage set of 111 occurs after pre-charging the bit lines, and when none of the programming nodes 308 are connected to the bit lines during memory cell programming. Accordingly, none of the bit lines have their voltages pulled down during the read cycle, since none are connected to drain terminal of the transistor 302.

Sensing circuit 206 of FIG. 2 can be a differential sense amplifier because at least one of the bit lines is always pulled down during memory cell read. Decoder circuit 306 can include a sense circuit (such as sense inverters as shown in FIG. 3B) because there are situations in reading memory array 300 that none of the bit lines is pulled down. More specifically, inverters 316 invert the respective voltages on the bit lines 310, the output of which is converted by logic circuits 318 to the 2-bit output 312. Accordingly, the sensing circuit in FIG. 3 can require less chip area than the differential sense amplifier.

FIG. 3C illustrates an example memory array 320 according to an embodiment of the present disclosure. According to this example, bit lines of multiple columns 322-1 to 322-n of memory cells are multiplexed using bit line column multiplexer 324 before being connected to decoder circuit 306. Accordingly, multiple column of the memory array can share the same decoder circuit 306. If columns 322-1 to 322-n share the bit lines, memory array 320 would require the CPD lines and, a person of skill in the art would appreciate based on the teachings herein that example memory array 320 can implemented using a CPD functionality as described above in FIG. 2, for example. The memory array 320 can be implemented such that multiple columns 322-1 to 322-n do not share the bit lines. When the multiple columns 322-1 to 322-n do not share the bit lines, the memory array 320 can be implemented without using a CPD functionality and the source terminals of the memory cell transistors will be coupled to ground, as shown in FIG. 3C.

In examples, bit line column multiplexer 324 can be a 32-to-1, a 64-to-1, or a 128-1 multiplexer. However, the embodiments of this disclosure are not limited to these examples and any multiplexer can be used for bit line column multiplexer 324. Memory array 320 can further includes a pre-charge circuit 328 (e.g., a voltage source) that is configured to pre-charge only the bit lines (and/or the bit lines' respective program nodes) of a selected column from which its data is to be read. In other words, when a memory cell is selected, pre-charge circuit 328 pre-charges only the bit lines (and/or the bit lines' respective program nodes) associated with the column of the selected memory cell using the bit line multiplexer 324. Also, the word line associated with the selected memory cell is also activated.

As discussed above and as illustrated by the truth table 326 shown in FIG. 3A, a "00" logic state is programmed in the memory cell by not connecting any of program nodes 308-1, 308-2, and 308-3 to the drain terminal of MOS transistor 302 ($X_0X_1X_2$=000). Therefore, none of the bit lines 310-1, 310-2, and 310-3 is connected to the drain terminal of MOS transistor 302. When none of the bit lines are connected to the drain terminal of MOS transistor 302, the load on the bit lines is decreased, which increases the speed or frequency that data can be accessed, and also results in decreased power consumption. In one embodiment of the present disclosure, the encoding method used for memory array is redefined based on the data pattern of each column. FIG. 4 illustrates exemplary memory programming and decoding methods according to an embodiment of the present disclosure. However, a person of skill in the art would appreciate based on the teachings herein that these are exemplary encoding methods and other methods can also be used.

As illustrated by example 401, the "00" logic state is the dominating logic state in the data pattern of a memory column. (Herein, "dominating logic state" means the most numerous logic state to be stored by a particular column in a memory cell array.) In this case, and referring to memory cell of FIG. 3A, the "00" logic state is programmed (also called "encoded") in the memory cell by not connecting any of program nodes 308-1, 308-2, and 308-3 to the drain terminal of MOS transistor 302 ($X_0X_1X_2$=000 resulting in $BL_0BL_1BL_2$=111 during the read cycle). Accordingly, there is no discharge of the dominant logic stage in example programming nodes during the read cycle. The truth table of example 401 illustrates how the other logic states can be programmed in the memory cell, where it can be seen that the other non-dominant logic states are each programmed by connecting a corresponding different BL to the memory cell (e.g. drain terminal of the MOS transistor 302). For example, "01" is programmed by connecting $BL_2$ to the memory cell, and "10" is programmed by connecting $BL_1$ to the memory cell. Also, equations 402 illustrate the decoding method that can be used during the read cycle for this example. In this example, the least significant bit (LSB) dout0 is the logic inversion of the conjunction between $BL_0$ and $BL_2$. The most significant bit (MSB) dout1 is the inversion of the conjunction between $BL_0$ and $BL_1$. One skilled in the art would understand how to build such a decoder logic circuit (e.g. state machine), using for example, AND gates and inverters, or other equivalent logic circuits.

Example 403 illustrates another example where the "01" logic state is the dominating logic state in the data pattern of the memory column. In this case, and referring to memory cell of FIG. 3A, the "01" logic state is programmed in the memory cell by not connecting any of program nodes 308-1, 308-2, and 308-3 to the drain terminal of MOS transistor 302 ($X_0X_1X_2$=000 resulting in $BL_0BL_1BL_2$=111 during the read cycle). The truth table of example 403 illustrates how the other logic states can be programmed in the memory cell. Also, equations 404 illustrate the decoding method that can be used during the read cycle for this example. In this example, the least significant bit (LSB) dout0 is the conjunction between $BL_1$ and $BL_2$. The most significant bit (MSB) dout1 is the negated of the conjunction between $BL_0$ and $BL_1$. One skilled in the art would understand how to build such a decoder logic circuit, using for example, AND gates and inverters, or other equivalent logic circuits.

Example 405 illustrates another example where the "10" logic state is the dominating logic state in the data pattern of the memory column. In this case, and referring to memory cell of FIG. 3A, the "10" logic state is programmed in the memory cell by not connecting any of program nodes 308-1, 308-2, and 308-3 to the drain terminal of MOS transistor 302 ($X_0X_1X_2$=000 resulting in $BL_0BL_1BL_2$=111 during the read cycle). The truth table of example 405 illustrates how the other logic states can be programmed in the memory cell. Also, equations 406 illustrate the decoding method that can be used during the read cycle for this example. In this example, the least significant bit (LSB) dout0 is the inversion of the conjunction between $BL_0$ and $BL_1$. The most significant bit (MSB) dout1 is the conjunction between $BL_1$ and $BL_1$. One skilled in the art would understand how to build such a decoder logic circuit, using for example, AND gates and inverters, or other equivalent logic circuits.

Finally, example 407 illustrates another example where the "11" logic state is the dominating logic state in the data pattern of the memory column. In this case, and referring to memory cell of FIG. 3A, the "11" logic state is programmed in the memory cell by not connecting any of program nodes 308-1, 308-2, and 308-3 to the drain terminal of MOS transistor 302 ($X_0X_1X_2$=000 resulting in $BL_0BL_1BL_2$=111 during the read cycle). The truth table of example 407 illustrates how the other logic states can be programmed in the memory cell. Also, equations 408 illustrate the decoding method that can be used during the read cycle for this example. In this example, the least significant bit (LSB) dout0 is the conjunction between $BL_1$ and $BL_2$. The most significant bit (MSB) dout1 is the conjunction between $BL_0$ and $BL_2$. One skilled in the art would understand how to build such a decoder logic circuit, using for example, AND gates and inverters, or other equivalent logic circuits.

FIG. 5 illustrates example memory arrays according to an embodiment of the present disclosure. For simplification purposes the MOS transistors (e.g. 302) of the memory cells are not shown in FIG. 5. FIG. 5 illustrates the bit lines $BL_0$, $BL_1$, and $BL_2$ for both memory arrays 501 and 511. FIG. 5 also illustrates the program nodes. The solid program nodes (e.g. filled-in circles) indicate that the program nodes are actually connected to the respective memory cell, where the empty nodes are not.

Memory array 501 is shown as an 8-row column of memory cells and is programmed without the selective encoding described in FIG. 4. The truth table 503 illustrates the method used for programming memory array 501. As illustrated in the truth table 503, the "00" logic state is programmed in the memory cell by not connecting any of program nodes to the memory cell (drain terminal of MOS transistor of the memory cell). In other words $BL_0BL_1BL_2$=111 is encoded to the "00" logic state. However, an analysis of the data bits that are stored on memory array 501 illustrates that the "01" logic state is the most numerous occurring logic state stored on memory array 501, and hence the dominant logic state. Six (6) memory cells out of eight (8) memory cells of memory array 501 are programmed to store the "01" logic state based on this exemplary data sample. For these memory cells, the program node on the bit line $BL_2$ is actually connected to the memory cell (drain terminal of MOS transistor of that memory cell). Each time a memory cell that stores logic state "01" is read, bit line $BL_2$ is pulled down. After the read is over, bit line $BL_2$ (and/or the program node associated with it) should be re-charged. Re-charging the bit line $BL_2$ (and/or the program node associated with it) results in power consumption that can be significant over multiple read cycles.

Memory array 511 is shown as an 8-row column and is programmed based on the selective encoding methods of the present disclosure. After reviewing the data bits (e.g., logic states) stored by memory array 511, it is noted that the "01" logic state is the most numerous occurring logic state stored on memory array 511. Accordingly, the "01" logic state is programmed in the memory cell by not connecting any of program nodes to the memory cell (drain terminal of MOS transistor of the memory cell). Accordingly, during the read cycle, the memory cells storing the "01" logic state will not have any node discharge, and $BL_0BL_1BL_2$=111 is decoded to the "01" logic state. This is similar to using the programming method 403 and decoding method 404 of FIG. 4. This is shown as the truth table 513. Therefore, now bit line $BL_2$ is not connected to any of the memory cells, which reduces the load on bit line $BL_2$ compared to memory array 501. This decrease in load results in more speed and less power consumption. This is at least because each time a memory cell that stores logic state "01" is read, no bit line is pulled down from its pre-charge voltage, and therefore, there is no need for re-charge before the next read cycle.

Further, in comparing the respective truth tables 503 and 513, it is noted that the truth table 513 is configured so that the dominant logic state "01" is assigned to the $BL_0BL_1BL_2=111$ during the read cycle, as compared to 110 for the truth table 503. If another logic state (say "10") was then dominant logic state in the memory cell column, then that logic state would be assigned 111. Accordingly, the disclosure contemplates examining the data to be stored for a particular column of memory cells, and configuring the controlling truth table to assign the dominant logic state to $BL_0BL_1BL_2=111$ during the read cycle, and likewise configuring the decoder circuit so that when 111 is read during the read cycle, the output of the decoder circuit is the dominant logic state.

FIG. 6 illustrates an example selective decoding circuit according to an embodiment of the present disclosure. FIG. 6 is similar to FIG. 3C in that multiple memory columns 322 are multiplexed using bit line column multiplexer 624 and pre-charge circuit 628 before being connected to sense circuit 605 (e.g., inverters). Accordingly, multiple columns of the memory array can share the same sense circuit 605 that can result in cost saving. Memory array 600 further includes decoder circuits 601. These decoder circuits 601 are also shared between multiple columns 322 of the memory array 600. Each of the decoder circuit 601 has input terminals that are connected to the sense circuit 605. Each of the decoder circuit 601 also has another input terminal that is configured to receive a select signal 603. Each of the decoder circuit 601 includes output terminals to output the logic state stored in the memory cell that is read.

As discussed above, each column of the memory array has been programmed based on analysis of the data bits (e.g., logic states) that are stored on that column. Depending on which logic state is the dominating logic state (e.g., occurs more frequently on that column), that column of the memory array is programmed based on one of the programming methods 401, 403, 405, or 407 of FIG. 4 and the corresponding one of the decoding methods 402, 404, 406, and 408 should be used. For example, decoder circuit 601-1 operates based on decoding method 402. Decoder circuit 601-2 operates based on decoding method 404. Decoder circuit 601-3 operates based on decoding method 406. Decoder circuit 601-4 operates based on decoding method 408. In one example, decoding methods 402, 404, 406, and 408 are stored (e.g., programmed) when the memory array is programmed. Storing the decoding methods can include creating and/or programming decoder circuits 601 and programming control circuit 700 discussed below with respect to FIG. 7.

Still referring to FIG. 6, each column 332 of the memory array 600 is associated with one decoding method. Therefore, when a specific column of the memory array is selected, a select signal 603 associated with that specific column is enabled (e.g., pulled high) such that the associated decoder circuit 601 is selected for decoding the associated bit line voltages that are sensed by the sense circuit 605. Accordingly, the data of that specific column can be correctly decoded using the correct decoder circuit 601 that corresponds to programming described above based on the dominant logic state.

By using the selective encoding methods discussed in the present disclosure, the worst case load can be cut by half. Also, the bit line load is reduced to half the number of rows, or a quarter of the 4-bit line design. This increases the bit line read cycle speed significantly. The current design also does not require a sense-amp-enable signal as is necessary when using a differential sense amplifier, which usually requires some timing margin for correct data capture. For a medium size ROM, the read cycle frequency can be increased by approximately 30% compared with existing architectures. Overall power consumption is also smaller because of the smaller bit line load, and the lack of adjacent columns influences. The amount of power saving can be around 25%.

FIG. 7 illustrates an exemplary control circuit 700 according to an embodiment of the present disclosure. Control circuit 700 includes pre-charge PMOS transistors 701, transistors 703 and 705, program nodes 707, and inverters 709. According to one example, control circuit 700 is configured to generate selection signals 603 used in the selective encoding apparatus 600 of FIG. 6.

Each of the pre-charge transistors 701 include a drain terminal that is connected to a pre-charge supply voltage, such as voltage Vdd. The gate terminal of each of the pre-charge transistors 701 is configured to receive a clock signal clk. The source terminal of each of the pre-charge transistors 701 is connected to a respective one of selection lines 711 that are also connected to the corresponding programming nodes 707. The selection lines 711 are connected to input terminals of the respective one of inverters 709. For example, the drain terminal of PMOS transistor 701-1 is connected to selection line 711-1, which is connected to an input terminal of inverter 709-1. The drain terminal of PMOS transistor 701-2 is connected to selection line 711-2, which is connected to an input terminal of inverter 709-2, and so on. Pre-charge transistors 701 are configured to pre-charge the selection lines 711 (and/or program nodes 707).

Transistors 703 include drain terminals, which are coupled through their associated program nodes to the selection lines 711. For example, the drain terminal of transistor 703-1 is coupled through its associated column program nodes 707-1, 707-2, 707-3, and 707-4 to selection line 711-1, which is connected to the input terminal of inverters 709-1. The gate of each of transistors 703 is configured to receive a control signal that indicates which column of the memory array is to be read. The source terminals of transistors 703 are connected to the drain terminal of the transistor 705. The source of transistor 705 is connected to a voltage low, such as ground. The gate of transistor 705 is configured to receive clock signal clk.

According to one example, the program nodes of control circuit 700 (such as program nodes 707) are programmed concurrently with when the memory array is being programmed. For example, the same layer(s) as memory array programming can be used for programming the program nodes of control circuit 700. The program nodes of control circuit 700 determine which decoder circuit 601 of FIG. 6 is to be used for each selected column of the memory array. For example, if column 1 of the memory array is programmed to use the decoder circuit 601-2 of FIG. 6, control circuit 700 should only enable selection signal $SEL_1$ (signal 603-2 in FIG. 6). Therefore, from program nodes 707 only program node 707-2 is connected to the drain of transistor 703-1. Other program nodes 707-1, 707-3, and 707-4 are disconnected from the drain of transistor 703-1. When column 1 of the memory array is selected, the gate of transistor 703-1 is pulled high and transistor 703-1 is turned on. Other transistors 703 are off. When transistor 703-1 is on, the drain of transistor 703-1 will be electrically coupled to a low voltage, such as ground, and will be pulled down. Since only program node 707-2 is connected to the drain of transistor 703-1, the input of inverter 709-2 will be low. The output of inverter 709-2 is high and therefore, signal $SEL_1$ is enabled. The input of inverters 709-1, 709-3, and 709-4 are not connected to the drain of transistor 703-1 as program nodes 707-1, 707-3, and 707-4 are not connected to the drain of transistor 703-1 in this example. The input of inverters 709-1, 709-3, and 709-4 are pulled high using pre-charge transistors 701-1, 701-3, and 7-4, respectively. Therefore, the output of inverters 709-1, 709-3, and 709-4 are pulled low and signals $SEL_0$, $SEL_2$, and $SEL_3$ are disabled. Accordingly, decoder circuit 601-2 would be used for accessing data stored on column 1.

As would be understood by a person skilled in the art based on the teachings herein, memory cell/array embodiments are not limited to 2-bit memory cells as described above in FIGS. 2-7, but extend to n-bit memory cells where n is any integer number. Further, embodiments are not limited to the example memory cell structure in FIGS. 3-7 (i.e., with three program nodes per memory cell), but extend to memory cell structures having more or less than three program nodes per memory cell, more or less than three bit lines coupled to each memory cell, and more or less than four decoder circuits.

FIG. 8 illustrate a method 800 according to an embodiment of the present disclosure. The method of flowchart 800 is described with continued reference to FIGS. 3-7. For example, the flowchart 800 can be implemented using memory arrays 300, 320, 600 and control circuit 700, and/or one or more processors. The method of flowchart 800 is not limited to these devices and can be implemented using other memory arrays and/or control circuits. The steps of the method of flowchart 800 are not limited to the order described below, and the various steps may be performed in a different order. Further, in embodiments, two or more steps of the method of flowchart 800 may be performed simultaneously with each other.

According to this exemplary method, at step 801 a data pattern to be stored in a column of a memory array is analyzed. This analysis can include determining, at step 803, the logic state that occurs most frequently (e.g., dominant logic state) in the data pattern to be stored. For example, referring to the memory array 511 of FIG. 5, the pattern of the data to be stored in memory array 511 is analyzed. This data includes logic states "01", "11", "01", "01", "01", "01", "10", and "01". In step 803, method 800 determines the logic state that occurs most frequently within the data to be stored in memory array 511 (e.g. the dominant logic state is determined). In other words, the dominant logic state is the most numerous logic state stored in the column.

At step 805, the column of the memory array is programmed based on this determination. For example, the memory array may be programmed at manufacturing time of the memory array by masking. Programming the column of the memory array can include determining a encoding method from, for example, methods 401, 403, 405, and 407 of FIG. 4 based on the determined logic state with the most numerous occurrence. The programming further includes connecting the program nodes to the memory cells of the column based on the determined encoding method. For example, as discussed with respect to FIG. 5, if the "01" logic state is the dominant logic state, then this logic state is programmed in the memory cell of memory array 511 by not connecting any of program nodes to the memory cell (drain terminal of MOS transistor of the memory cell) for the dominant logic state. In other words $BL_0BL_1BL_2$=111 is encoded to the "01" logic state. The other logic states are encoded so as to connect individually different bit lines to the drain terminal of the memory cells, for example, based on the truth table 513. Stated another way, once the most dominant logic state is determined, then the corresponding truth table is selected to insure proper encoding and decoding. For example, the logic state "11" is encoded by connecting $BL_0$ to the drain terminal of the memory cell, and logic state "10" is encoded by connecting $BL_1$ to the memory cell.

At step 807, a control circuit is programmed based on the determined logic state with the highest frequency and the programmed column of the memory array. For example, by referring to FIG. 7, if the column to be programmed is column 1 and the decoding circuit to be used is decoding circuit 601-2 (of FIG. 6), program nodes 707 are programmed such that only program node 707-2 is actually connected to the drain of transistor 703-1. The control circuit can be programmed using the same layer(s) as the memory array programming and at the same time as memory array programming (e.g., at manufacture time by masking.)

It will be apparent to persons skilled in the relevant art(s) that various elements and features of the present disclosure, as described herein, can be implemented in hardware using analog and/or digital circuits, through the execution of instructions by one or more processors, or as a combination of hardware and computer instructions.

FIG. 9 illustrates an example computer system 900 in which the present disclosure, or portions thereof, can be implemented as computer-readable code. For example, all or portions of method 800 can be implemented by computer system 900. Various embodiments of the disclosure are described in terms of this example computer system 900. After reading this description, it will become apparent to a person skilled in the relevant art how to implement the disclosure using other computer systems and/or computer architectures.

Computer system 900 includes one or more processors, such as processor 904. Processor 904 can be a processor configured to implement one or more embodiments described herein, such as described by method 800 of FIG. 8, by executing computer instructions. Processor 904 is connected to a communication infrastructure 906 (for example, a bus or network).

Computer system 900 also includes a main memory 908, preferably random access memory (RAM), and may also include a secondary memory 910. Secondary memory 910 may include, for example, a hard disk drive 912, a removable storage drive 914, and/or a memory stick. Removable storage drive 914 may comprise a floppy disk drive, a magnetic tape drive, an optical disk drive, a flash memory, or the like. The removable storage drive 914 reads from and/or writes to a removable storage unit 918 in a well-known manner. Removable storage unit 918 may comprise a floppy disk, magnetic tape, optical disk, etc. that is read by and written to by removable storage drive 914. As will be appreciated by persons skilled in the relevant art(s), removable storage unit 918 includes a computer usable storage medium having stored therein computer instructions and/or data.

In alternative implementations, secondary memory 910 may include other similar means for allowing computer programs or other instructions to be loaded into computer system 900. Such means may include, for example, a removable storage unit 922 and an interface 920. Examples of such means may include a program cartridge and cartridge interface (such as that found in video game devices), a removable memory chip (such as an EPROM, or PROM) and associated socket, and other removable storage units 922 and interfaces 920 that allow computer instructions and data to be transferred from the removable storage unit 922 to computer system 900.

Computer system 900 may also include a communications interface 924. Communications interface 924 allows computer instructions and data to be transferred between computer system 900 and external devices. Communications interface 924 may include a modem, a network interface (such as an Ethernet card), a communications port, a PCM-CIA slot and card, or the like. Computer instructions and data transferred via communications interface 924 are in the form of signals that may be electronic, electromagnetic, optical, or other signals capable of being received by communications interface 924. These signals are provided to communications interface 924 via a communications path 926. Communications path 926 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 918, removable storage unit 922, and a hard disk installed in hard disk drive 912. Computer program medium and computer usable medium can also refer to memories, such as main memory 908 and secondary memory 910, which can be memory semiconductors (e.g. DRAMs, etc.). These computer program products are means for providing computer instructions to computer system 900.

Computer programs (also called computer control logic) are stored in main memory 908 and/or secondary memory 910. Computer programs may also be received via communications interface 924. Such computer programs, when executed, enable computer system 900 to implement the present disclosure as discussed herein. In particular, the computer programs, when executed, enable processor 904 to implement the processes of the present disclosure. Accordingly, such computer programs represent controllers of the computer system 900. Where the disclosure is implemented using computer programs (having computer instructions), the computer programs may be stored in a computer program product and loaded into computer system 900 using removable storage drive 914, interface 920, hard drive 912 or communications interface 924.

The disclosure is also directed to computer program products comprising computer programs stored on any computer useable medium. Such computer programs, when executed in one or more data processing device(s), causes a data processing device(s) to operate as described herein. Embodiments of the disclosure employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, or other hardware memories).

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims and their equivalents.

What is claimed is:

1. A read only memory (ROM), comprising:
a plurality of bit lines charged to a predetermined voltage prior to a read cycle of the ROM;
a column of memory cells, each memory cell storing data having a logic state that is one of a plurality of available logic states stored by the column of memory cells, wherein the plurality of available logic states are characterized by a dominant logic state and a plurality of remaining logic states that are not the dominant logic state, wherein the dominant logic state is the most numerous logic state stored in the column of memory cells, each memory cell including:
a transistor having drain, source, and gate terminals; and
a plurality of program nodes, each program node connected to a corresponding bit line of the plurality of bit lines and capable of being connected to the drain terminal of the transistor;
wherein the plurality of remaining logic states are stored in a first subset of memory cells of the column of memory cells, by a connection between a corresponding program node and the drain terminal of the transistor in each memory cell of the first subset of memory cells, and
wherein the dominant logic state is stored in a second subset of memory cells of the column of memory cells, by an absence of connections between all of the plurality of program nodes and the drain terminal of the transistor in each memory cell of the second subset of memory cells.

2. The ROM of claim 1, further comprising a decoder circuit, coupled to the plurality of bit lines, and configured to decode voltages on the plurality of bit lines to determine the logic state of the data stored in each memory cell of the plurality of memory cells.

3. The ROM of claim 1, wherein during a read cycle of a memory cell in the first subset of memory cells, one bit line of the plurality of bit lines is discharged by the corresponding transistor of the memory cell to indicate the logic state stored by the memory cell.

4. The ROM of claim 3, wherein the one bit line that is discharged is connected to the drain terminal of the transistor by the corresponding program node.

5. The ROM of claim 1, wherein during a read cycle of a memory cell in the second subset of memory cells, none of the plurality of bit lines is discharged so as to indicate that the logic state stored by the memory cell is the dominant logic state.

6. The ROM of claim 1, wherein a value of the data stored in a memory cell of the first subset of memory cells is based on a location of the corresponding program node that is connected to the drain terminal of the transistor, the location being relative to locations of non-connected program nodes.

7. The ROM of claim 1, wherein a value of the data stored in a memory cell of the second subset of memory cells is based on none of the program nodes being connected to the drain terminal of the transistor.

8. The ROM of claim 1, further comprising a sense circuit coupled to the plurality of bit lines and configured to detect voltages on the plurality of bit lines, and output corresponding sensed voltages.

9. The ROM of claim 1, further comprising a plurality of decoder circuits, each decoder circuit of the plurality of decoder circuits configured to provide a data output based on voltages sensed from the plurality of bit lines, the data output representative of the data stored in a memory cell of the column of memory cells that is read during the read cycle.

10. The ROM of claim 1, further comprising a plurality of decoder circuits, each decoder circuit of the plurality of decoder circuits configured to execute a corresponding logic truth table that is different from that of the other decoder circuits and corresponding to a different logic state being the dominant logic state for the column of memory cells.

11. The ROM of claim 10, wherein only one of the plurality of decoder circuits is enabled to determine the data stored in a memory cell of the column of memory cells, and wherein the enabled decoder circuit is selected based on which logic state of the plurality of logic states is the dominant logic state.

12. The ROM of claim 11, further comprising a control circuit configured to generate an enable signal to select the only one decoder circuit of the plurality of decoder circuits that is enabled to determine the data stored in a memory cell of the column of memory cells.

13. The ROM of claim 12, wherein the control circuit comprises:
a second transistor having drain, source, and gate terminals; and
a plurality of second program nodes, each of the second program nodes charged to a predetermined voltage and coupled to a respective one of a plurality of selection lines,
wherein at most one of the plurality of second program nodes is coupled to the drain terminal of the second transistor to select the one decoder circuit of the plurality of decoder circuits.

14. The ROM of claim 13, further comprising:
a plurality of inverters, wherein each of the plurality of inverters has an input terminal and an output terminal,
wherein the input terminal of each of the plurality of inverters is connected to a respective one of the plurality of selection lines, and
wherein the output terminal of each of the plurality of inverters is connected to a respective one of the plurality of decoder circuits to selectively enable the respective one of the plurality of decoder circuits.

15. The ROM of claim 1, further comprising a plurality of decoder circuits including a first decoder circuit and a second decoder circuit, the first decoder circuit configured to execute a first logic truth table that is determined based on a first logic state of the plurality of logic states being the dominant logic state for the column of memory cells, and the second decoder circuit configured to execute a second logic truth table that is determined based on a second logic state of the plurality of logic states being the dominant logic state for the column of memory cells, wherein the second logic truth table is different from the first logic truth table.

16. A read only memory (ROM), comprising:
a plurality of bit lines charged to a predetermined voltage prior to a read cycle of the ROM;
a column of memory cells, each memory cell storing data having a logic state that is one of a plurality of available logic states stored by the column of memory cells, wherein the plurality of available logic states are characterized by a dominant logic state and a plurality of remaining logic states that are not the dominant logic state, wherein the dominant logic state is the most numerous logic state stored in the column of memory cells, each memory cell including:
a transistor having drain, source, and gate terminals; and
a plurality of program nodes, each program node connected to a corresponding bit line of the plurality of bit lines and capable of being connected to the drain terminal of the transistor;
wherein the plurality of remaining logic states are stored in a first subset of memory cells of the column of memory cells, by connecting a corresponding program node to the drain terminal of the transistor in each memory cell of the first subset of memory cells, and
wherein the dominant logic state is stored in a second subset of memory cells of the column of memory cells, by not connecting any of the plurality of program nodes to the drain terminal of the transistor in each memory cell of the second subset of memory cells.

17. The ROM of claim 16, further comprising a plurality of decoder circuits, each decoder circuit of the plurality of decoder circuits configured to provide a data output based on voltages sensed from the plurality of bit lines during the read cycle, the data output representative of the data stored in a memory cell of the column of memory cells that is read during the read cycle.

18. The ROM of claim 17, wherein the sensed voltages from the plurality of bit lines are all the predetermined voltage when the memory cell of the column of memory cells that is read during the read cycle is storing the dominant logic state.

19. The ROM of claim 18, wherein exactly one of the sensed voltages from the plurality of bit lines is discharged relative to the predetermined voltage when the memory cell of the column of memory cells that is read during the read cycle is storing one of the plurality of remaining logic states that are not the dominant logic state.

20. The ROM of claim 17, wherein each decoder circuit of the plurality of decoder circuits is configured to execute a corresponding logic truth table that is different from that of the other decoder circuits, and each decoder circuit of the plurality of decoder circuits corresponds to a different logic state being the dominant logic state for the column of memory cells.

21. The ROM of claim 1, wherein the data stored in the each memory cell includes a plurality of data bits having corresponding logical values that collectively determine the logic state stored in the each memory cell.

22. The ROM of claim 16, wherein the data stored in the each memory cell includes a plurality of data bits having corresponding logical values that collectively determine the logic state stored in the each memory cell.

* * * * *